United States Patent
Gutman et al.

(10) Patent No.: US 7,060,627 B2
(45) Date of Patent: Jun. 13, 2006

(54) METHOD OF DECREASING CHARGING EFFECTS IN OXIDE-NITRIDE-OXIDE (ONO) MEMORY ARRAYS

(75) Inventors: Micha Gutman, Migdal Haemek (IL); Yakov Roizin, Afula (IL); Menachem Vofsy, Migdal Haemek (IL); Efraim Aloni, Migdal Haemek (IL); Avi Ben-Gigi, Migdal haemek (IL); Fumihiko Noro, Kyoto (JP); Masatoshi Arai, Kyoto (JP); Nobuyoshi Takahashi, Kyoto (JP); Koji Yoshida, Kyoto (JP)

(73) Assignee: Tower Semiconductor Ltd., Migdal Haemek (IL)

( * ) Notice: Subject to any disclaimer, the term of this patent is extended or adjusted under 35 U.S.C. 154(b) by 0 days.

(21) Appl. No.: 10/659,042

(22) Filed: Sep. 9, 2003

(65) Prior Publication Data

US 2005/0054161 A1    Mar. 10, 2005

(51) Int. Cl.
*H01L 21/302*  (2006.01)
*H01L 21/461*  (2006.01)

(52) U.S. Cl. .................. 438/714; 438/724; 438/723

(58) Field of Classification Search ............... 438/257, 438/258, 199, 201, 261, 262, 260, 714, 703, 438/723, 724, 743, 744, 954
See application file for complete search history.

(56) References Cited

U.S. PATENT DOCUMENTS

| | | | | |
|---|---|---|---|---|
| 5,395,786 A | * | 3/1995 | Hsu et al. | 438/248 |
| 5,789,291 A | * | 8/1998 | Sung | 438/254 |
| 5,910,912 A | * | 6/1999 | Hsu et al. | 257/321 |
| 6,107,141 A | * | 8/2000 | Hsu et al. | 438/267 |
| 6,174,758 B1 | * | 1/2001 | Nachumovsky | 438/199 |
| 6,346,442 B1 | * | 2/2002 | Aloni et al. | 438/258 |
| 6,352,895 B1 | * | 3/2002 | Lam | 438/253 |
| 6,548,348 B1 | * | 4/2003 | Ni et al. | 438/253 |
| 6,570,209 B1 | * | 5/2003 | Lam | 257/306 |
| 6,583,066 B1 | * | 6/2003 | Aloni et al. | 438/714 |
| 6,689,653 B1 | * | 2/2004 | Seah et al. | 438/201 |
| 6,765,259 B1 | * | 7/2004 | Kim | 257/315 |

\* cited by examiner

*Primary Examiner*—Michael Lebentritt
*Assistant Examiner*—Walter L. Lindsay, Jr.
(74) *Attorney, Agent, or Firm*—Bever, Hoffman & Harms, LLP; E. Eric Hoffman

(57) ABSTRACT

A fieldless array includes a semiconductor substrate, a plurality of oxide-nitride-oxide (ONO) structures formed over the upper surface of the semiconductor substrate, and a plurality of word lines formed over the ONO structures, wherein each of the ONO structures is substantially covered by one of the word lines. The word lines (typically polysilicon) block UV irradiation during subsequent processing steps, thereby substantially preventing electrons from being trapped in the silicon nitride layer of the ONO structure. As a result, the threshold voltages of the fieldless array transistors do not severely increase as the width of the fieldless array transistors decrease.

15 Claims, 13 Drawing Sheets

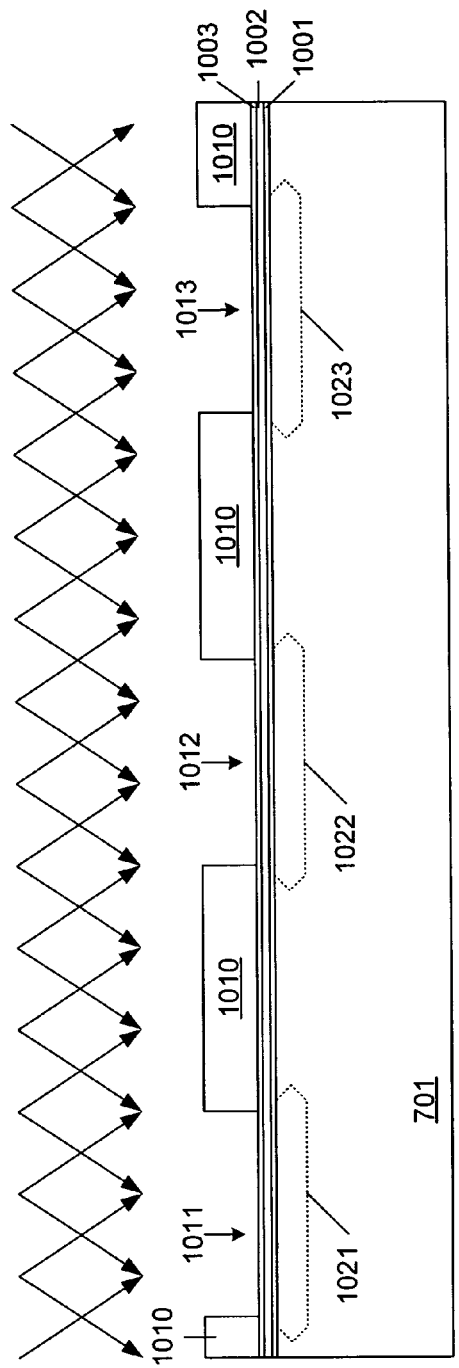
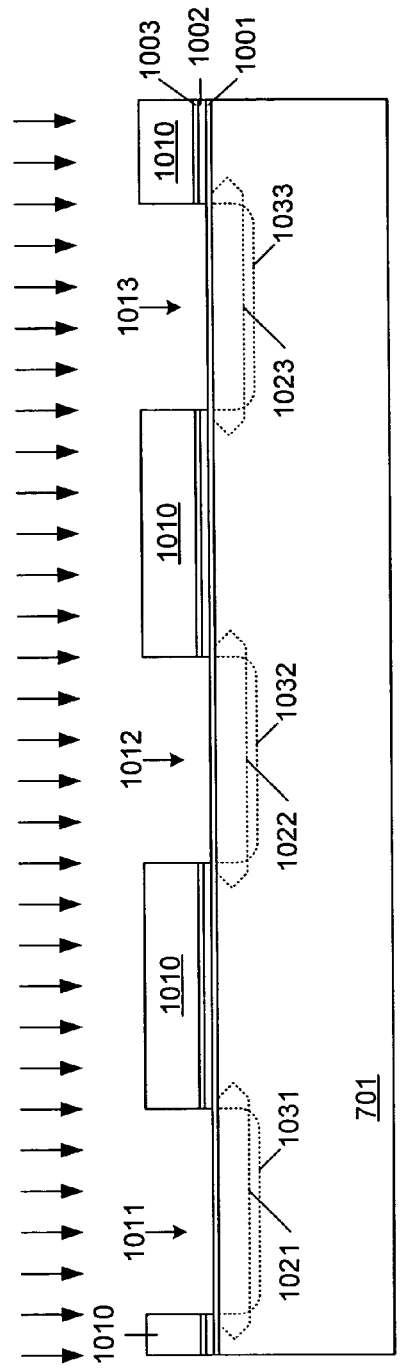

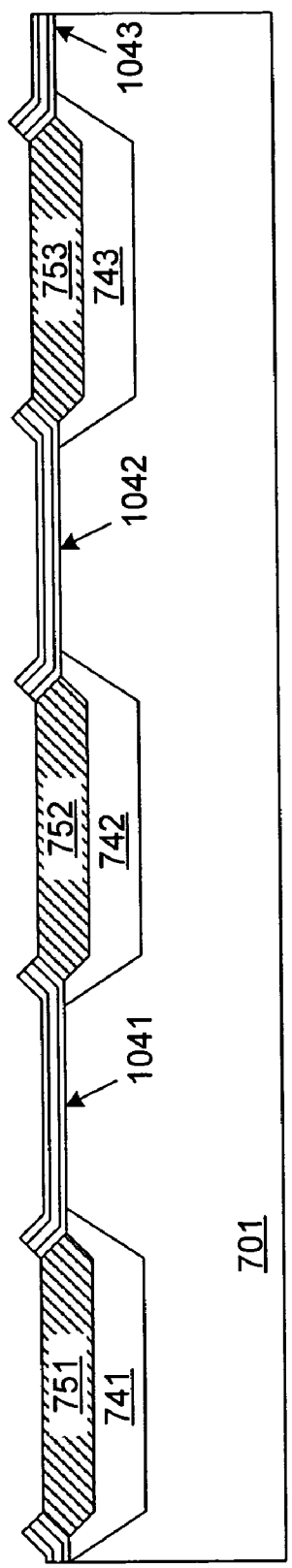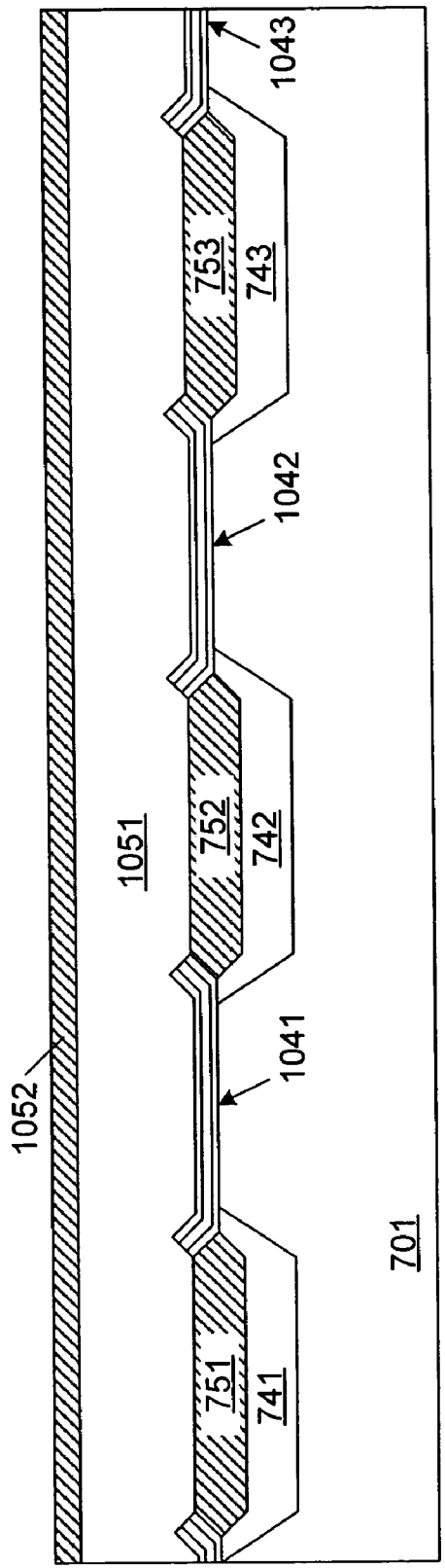
FIG. 10C
FIG. 10D

METHOD OF DECREASING CHARGING EFFECTS IN OXIDE-NITRIDE-OXIDE (ONO) MEMORY ARRAYS

FIELD OF THE INVENTION

The present invention relates to a method for decreasing the charging effects in the silicon nitride layer of an ONO structure.

RELATED ART

FIG. 1 is an isometric view of a portion of a conventional fieldless array 100, which includes a plurality of 2-bit non-volatile memory transistors arranged in a plurality of rows and columns. Fieldless array 100 exhibits a cross-point pattern, as illustrated. A fieldless array is defined as an array that does not use field oxide to isolate the various elements of the array. Because field oxide is not required to isolate the memory transistors in a fieldless array, the memory transistors can be laid out with a relatively high density.

Fieldless array 100 includes 2-bit non-volatile memory transistor 110, which is identified by dashed lines in FIG. 1. The 2-bit non-volatile memory transistors located in a fieldless array will hereinafter be referred to as "fieldless array transistors". FIG. 2A is a cross sectional view of fieldless array transistor 110 along section line A–A' of FIG. 1. FIG. 2B is a cross sectional view of fieldless array transistor 110 along section line B–B' of FIG. 1.

Fieldless array 100 includes a plurality of n-type diffusion bit lines 141–143 that extend in parallel along a first axis of a p-type semiconductor region 101. Each of the diffusion bit lines 141–143 is covered by a corresponding bit line oxide layer 151–153. Oxide-Nitride-Oxide (ONO) structures 161–163 extend in parallel along the first axis, between adjacent diffusion bit lines. For example, ONO structure 161 is located between diffusion bit lines 141 and 142, with the ends of ONO structure 161 extending over the edges of diffusion bit lines 141–142 and the edges of bit line oxide layers 151–152. ONO structure 161, which is shown in more detail in FIG. 2A, includes lower silicon oxide layer 11, silicon nitride layer 12 and upper silicon oxide layer 13. Polycide word lines 170 and 180 extend in parallel along a second axis that is perpendicular to the first axis. Polycide word line 170 includes conductively doped polysilicon layer 171 and metal silicide layer 172. Similarly, polycide word line 180 includes conductively doped polysilicon layer 181 and metal silicide layer 182. Note that fieldless array transistor 110 includes a silicon-oxide-nitride-oxide-silicon (SONOS) structure that includes substrate 101, ONO layer 161 and polysilicon layer 171.

Diffusion bit lines 141 and 142 form the source and drain, respectively, of fieldless array transistor 110. Diffusion bit lines 141 and 142 also form the source and drain, respectively, of an adjacent transistor that includes polycide word line 180 and ONO structure 161. Thus, the sources and drains of the fieldless array transistors extend laterally beyond the gates of these transistors. Furthermore, diffusion bit line 142 also forms the source in another adjacent fieldless array transistor, which includes polycide word line 170, ONO structure 162 and diffusion bit line 143 (which forms the drain of this adjacent transistor).

An insulating material, such as dielectric sidewall spacers, or gap filling oxide, can be formed between the polycide word lines 170 and 180. Dashed lines 191-192 illustrate the general location of dielectric sidewall spacers associated with polycide word line gate 170. Dashed lines 193 and 194 illustrate the general location of gap filling oxide associated with polycide word line 170. Dielectric sidewall spacers 191–192 are illustrated in FIG. 4A. Similarly, gap filling oxide 193–194 is illustrated in FIG. 4B.

The operation of fieldless array 100 is described in more detail in U.S. Pat. Nos. 6,256,231 B1, 6,181,597 and 6,081,456. In general, a first data bit is stored in charge trapping region 21 in silicon nitride layer 12, and a second data bit is stored in charge trapping region 22 of silicon nitride layer 12. Programming is performed by channel hot electrons (CHE) that are trapped in charge trapping regions 21 and 22 of silicon nitride layer 12 at the drain junction edge. Holes, created by band-to-band tunneling (BBT) in drain regions 141–142 erase the associated programmed bits. Fieldless array transistor 110 is read in the reverse direction of programming.

The narrow channel effects (NCE) in a 2-bit fieldless array transistor are much stronger than in standard MOS devices. Narrow channel effects cause the threshold voltage (Vt) of a transistor to increase as the width of the transistor channel decreases. The observed threshold voltage (Vt) increase is related to the process ultra-violet (UV) irradiation, which results in charging of the ONO layer at the edges of fieldless array transistors.

In-process charging is a well-known phenomenon in non-volatile memory cells having polysilicon floating gates. Ultra-violet initialization is usually employed to decrease the charge of the electrons trapped in the polysilicon floating gate. In contrast, exposure of a silicon-oxide-nitride-oxide-silicon (SONOS) structure to UV irradiation, leads to an increase in electronic charge trapped in the ONO layer.

FIG. 3 is a schematic diagram illustrating the charging process associated with electron excitation from the valence band of silicon. Electrons overcome the potential barrier at the interface of the silicon substrate 101 and the bottom silicon oxide layer 11, and are trapped in the silicon nitride layer 12. These electrons are manifested as a threshold voltage (Vt) increase in the associated fieldless array transistor 110. UV radiation is always present in the plasma and implantation processes of integrated circuit fabrication. Thus, a certain degree of charging is always present in the silicon nitride of an ONO layer.

In fieldless array 100, the polysilicon etch that forms polysilicon regions 171 and 181 stops at the upper oxide layer (e.g., oxide layer 13) of the associated ONO structures (e.g., ONO structure 161). When the dielectric sidewall spacers 191–192 or gap-filling oxide 193–194 is subsequently formed, the ONO structure 161 remains untouched under these dielectric spacers or gap-filling oxide. FIG. 4A is a cross sectional view along section line B–B' of FIG. 1, illustrating dielectric sidewall spacers 191–192 after LDD etchback (spacer formation). Note that ONO layer 161 remains untouched under spacers 191–192. FIG. 4B is a cross sectional view along section line B–B' of FIG. 1, illustrating gap filling oxide 193–194. ONO layer 161 remains untouched under gap filling oxide 193–194.

FIGS. 4A and 4B also illustrate the manner in which silicon nitride layer 12 is charged in response to UV irradiation. Valence band electrons excited in silicon substrate 101 are trapped in silicon nitride layer 12 at the edges of fieldless array transistor 110. These trapped electrons result in threshold voltage roll-off for narrow fieldless array transistors (i.e., transistors having a narrow width along the first axis of FIG. 1). Note that polysilicon region 171 effectively blocks the UV radiation from reaching the channel region of fieldless array transistor 110.

FIG. 5 is a graph that illustrates the relationship between threshold voltage increase and polysilicon word line width at the metal-1 (M1) process stage and the end of line (EOL) process stage. Note that the threshold voltage increases dramatically as the width of the polysilicon word line decreases below 0.4 microns.

Subsequent bakes (up to 475° C.) can only partially reduce the charge trapped in silicon nitride layer 12.

There are two reasons why charging the nitride layer in a SONOS fieldless array transistor is dangerous. First, there are a limited number of traps in the silicon nitride layer. If some of these traps are already occupied (due to UV irradiation), programming the fieldless array transistor to a higher threshold voltage level results in two high densities of electron charge in a certain volume. Some of the electrons occupy states with lower activation energy. The trapped charges also strongly repulse. The memory retention performance is thus degraded. Second, degradation effects can occur at the Si—SiO$_2$ interface when negative charge is trapped in the floating gate after 400° C. H$_2$ bakes. (See, C. K. Barlingay, Randy Yach, Wes Lukaszek, "Mechanism Of Charge Induced Plasma Damage To EPROM Cells", 7$^{th}$ Symposium on Plasma and Process Induced Damage, June 2002 Hawaii.) This also results in enhanced retention loss. FIG. 6 is a graph illustrating the retention loss (defined by the threshold voltage Vt in millivolts) after 10 k program/erase cycles and a 250° C./24 hour bake for a wafer at the metal-1 stage, a wafer at the end-of-line stage, and a wafer at the metal-1 stage with an additional 30 minutes of UV exposure. As illustrated in FIG. 6, data retention loss increases as UV exposure increases.

It would therefore be desirable to have a method and structure for decreasing the threshold voltage of fieldless array transistors as the widths of these transistors decrease.

SUMMARY

Accordingly, the present invention provides an array of fieldless array transistors, wherein the ONO structure is completely removed between the word lines. In this configuration, each of the ONO structures is entirely covered by an associated polysilicon word line. The polysilicon word line blocks UV irradiation during subsequent processing steps, thereby substantially preventing electrons from being trapped in the silicon nitride layer of the ONO structure.

In accordance with one embodiment, a fieldless array includes a semiconductor region having a first conductivity type, a plurality of ONO structures formed over the upper surface of the semiconductor region, and a plurality of word lines formed over the ONO structures, wherein each of the ONO structures is substantially covered by one of the word lines. The word lines can be, for example, polysilicon or polycide.

The fieldless array will typically include a plurality of diffusion bit lines formed in the semiconductor region, wherein the diffusion bit lines have a second conductivity type, opposite the first conductivity type. Bit line oxide regions will be formed over the diffusion bit lines, wherein the word lines extend over the bit line oxide regions.

Dielectric sidewall spacers or gap-filling oxide can be located adjacent to (and between) the word lines. However, the ONO structures are not located beneath the dielectric sidewall spacers or gap-filling oxide.

The present invention also includes a method of fabricating a fieldless array. This method includes the steps of: (1) forming an oxide-nitride-oxide (ONO) layer over a surface of a semiconductor region, (2) patterning the ONO layer to create a first set of ONO structures that define locations for a plurality of diffusion bit lines of the fieldless array, (3) forming a plurality of word lines over the first set of ONO structures, and (4) patterning the first set of ONO structures, thereby creating a second set of ONO structures, wherein the second set of ONO structures are located entirely under the plurality of word lines.

Again, dielectric sidewall spacers or gap-filling oxide can be formed adjacent to (or between) the word lines.

In accordance with one embodiment, the steps of forming a plurality of word lines and patterning the first set of ONO structures can include the steps of (1) depositing a layer of polysilicon over the first set of ONO structures, (2) forming a photoresist mask over the layer of polysilicon, (3) etching the layer of polysilicon through the photoresist mask, and (4) etching the first set of ONO structures through the photoresist mask.

The present invention will be more fully understood in view of the following description and drawings.

BRIEF DESCRIPTION OF THE DRAWINGS

FIGS. 10A–10E are cross sectional views of the fieldless array of FIG. 7 along section line AA–AA' of FIG. 7 during various process steps.

DETAILED DESCRIPTION

Figure 7:
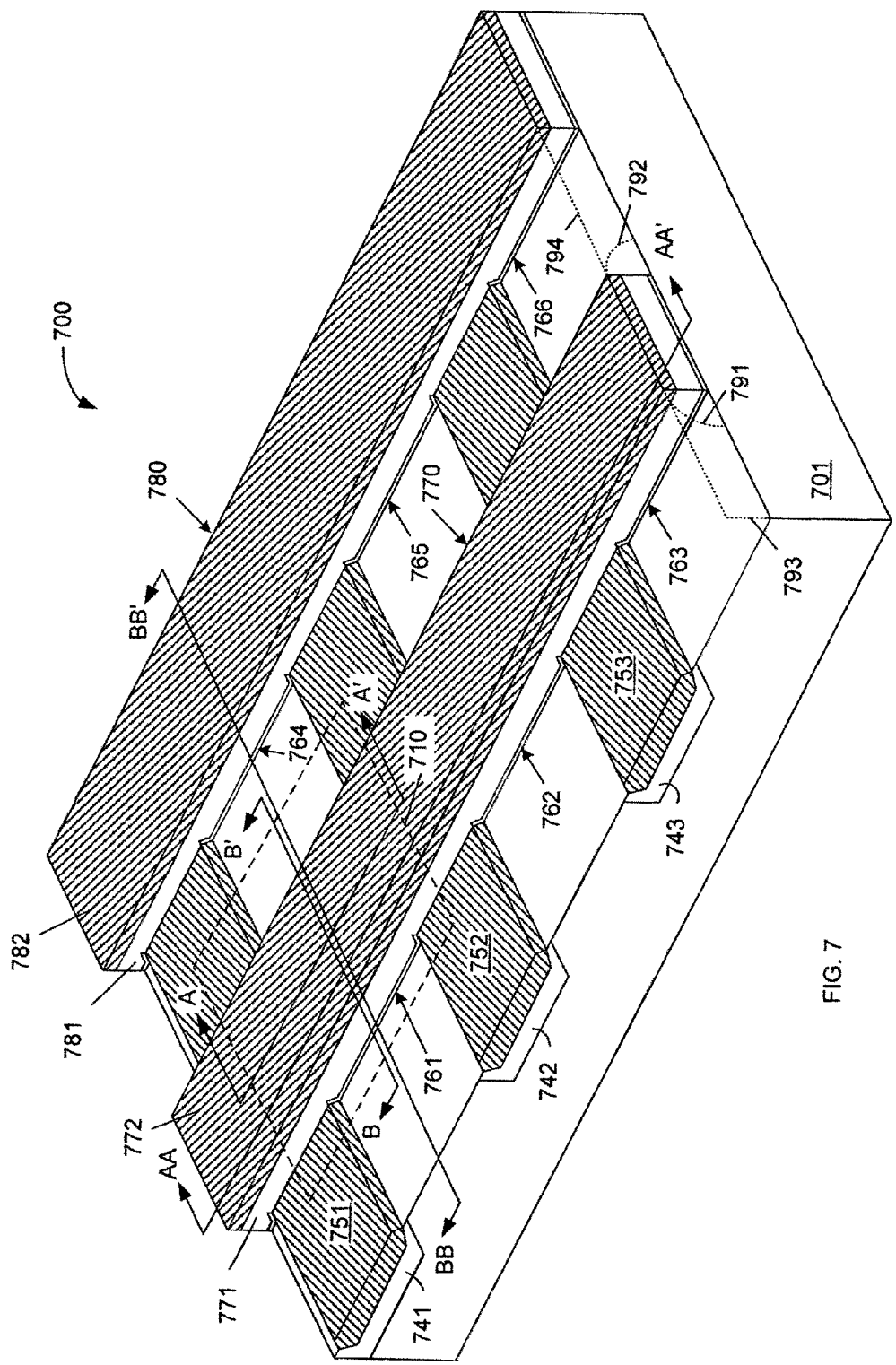
FIG. 7 is an isometric view of a portion of a fieldless array in accordance with one embodiment of the present invention.

FIG. 7 is an isometric view of a portion of a fieldless array 700 in accordance with one embodiment of the present invention. Fieldless array 700 includes a plurality of 2-bit fieldless array memory transistors, including transistor 710, arranged in a plurality of rows and columns. Although a small portion of fieldless array 700 is illustrated, one of ordinary skill in the art would be able to expand this fieldless array by following the pattern disclosed in FIG. 7.

Figure 8:
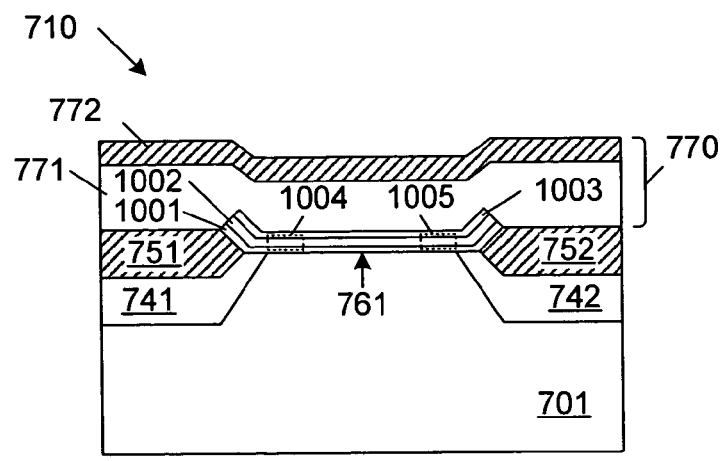

FIG. 8 is a cross sectional view of fieldless array transistor 710 along section line A–A' of FIG. 7.

Figure 9A:
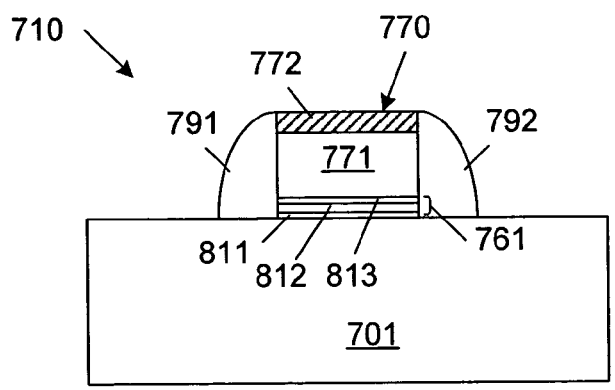
FIG. 9A is a cross sectional view of a fieldless array transistor along section line A–A' of FIG. 7 in accordance with one embodiment of the present invention, wherein dielectric sidewall spacers are formed adjacent to the word line.

FIG. 9A is a cross sectional view of fieldless array transistor 710 along section line B–B' of FIG. 7, in accordance with one embodiment of the present invention, wherein dielectric sidewall spacers 791–792 are formed adjacent to word line 770.

Figure 9B:
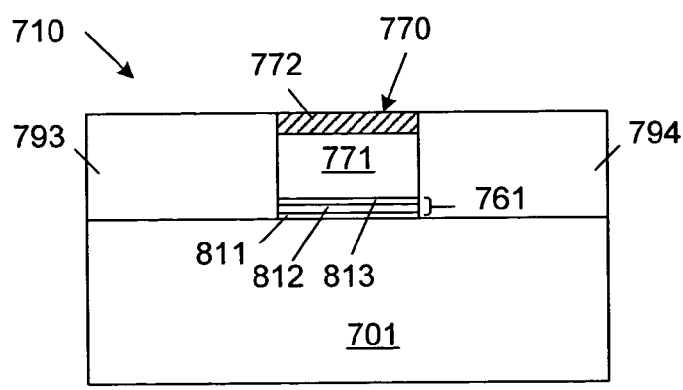
FIG. 9B is a cross sectional view of a fieldless array transistor along section line B–B' of FIG. 7, wherein gap filling oxide is formed adjacent to the word line.

FIG. 9B is a cross sectional view of fieldless array transistor 710 along section line B–B' of FIG. 7, in accordance with another embodiment of the present invention, wherein gap filling oxide 793–794 is formed adjacent to word line 770.

Fieldless array 700 is fabricated in semiconductor region 701. In the described example, semiconductor region 701 is p-type monocrystalline silicon (although this is not necessary). A plurality of n-type diffusion bit lines 741–743 located in semiconductor region 701 extend in parallel along a first axis. Each of the diffusion bit lines 741–743 is covered by a corresponding bit line oxide layer 751–753. Oxide-Nitride-Oxide (ONO) structures 761–763 are located under word line 770, and ONO structures 764–766 are located under word line 780. In accordance with one embodiment of the present invention, ONO structures 761–766 are located entirely under the associated word lines 770 and 780. As described in more detail below, this structure minimizes the negative charge trapped in ONO structures 761–766 during UV irradiation. As a result, the increase in threshold voltage is minimized as the word lines become narrower.

ONO structure 761 is located between diffusion bit lines 741 and 742, with the ends of ONO structure 761 extending over the edges of diffusion bit lines 741–742 and the edges of bit line oxide layers 751–752. ONO structures 762–766 are located in a similar manner. ONO structure 761, which is shown in more detail in FIGS. 8A and 8B, includes bottom silicon oxide layer 1001, silicon nitride layer 1002 and top silicon oxide layer 1003. Silicon nitride layer 1002 includes charge-trapping regions 1004 and 1005, as illustrated.

Word lines 770 and 780 extend in parallel along a second axis that is perpendicular to the first axis. In the described examples, word lines 770 and 780 are polycide (although this is not necessary). Word line 770 includes conductively doped polysilicon layer 771 and overlying metal silicide layer 772. Similarly, word line 780 includes conductively doped polysilicon layer 781 and overlying metal silicide layer 782. Note that fieldless array transistor 710 includes a silicon-oxide-nitride-oxide-silicon (SONOS) structure that includes substrate 701, ONO structure 761 and polysilicon layer 771.

Diffusion bit lines 741 and 742 form the source and drain, respectively, of fieldless array transistor 710. Diffusion bit lines 741 and 742 also form the source and drain, respectively, of an adjacent transistor that includes word line 780 and ONO structure 764. Thus, the sources and drains of the fieldless array transistors extend laterally beyond the gates of these transistors. Furthermore, diffusion bit line 742 also forms the source in another adjacent fieldless array transistor, which includes word line 770, ONO structure 762 and diffusion bit line 743.

An insulating material, such as dielectric sidewall spacers, or gap-filling oxide, is formed between word lines 770 and 780 (and between these word lines and adjacent word lines, which are not shown). Dashed lines 791-793 illustrate the general location of dielectric sidewall spacers associated with word lines 770 and 780. Dashed lines 794 and 795 illustrate the general location of gap-filling oxide associated with word lines 770 and 780.

Figure 1:
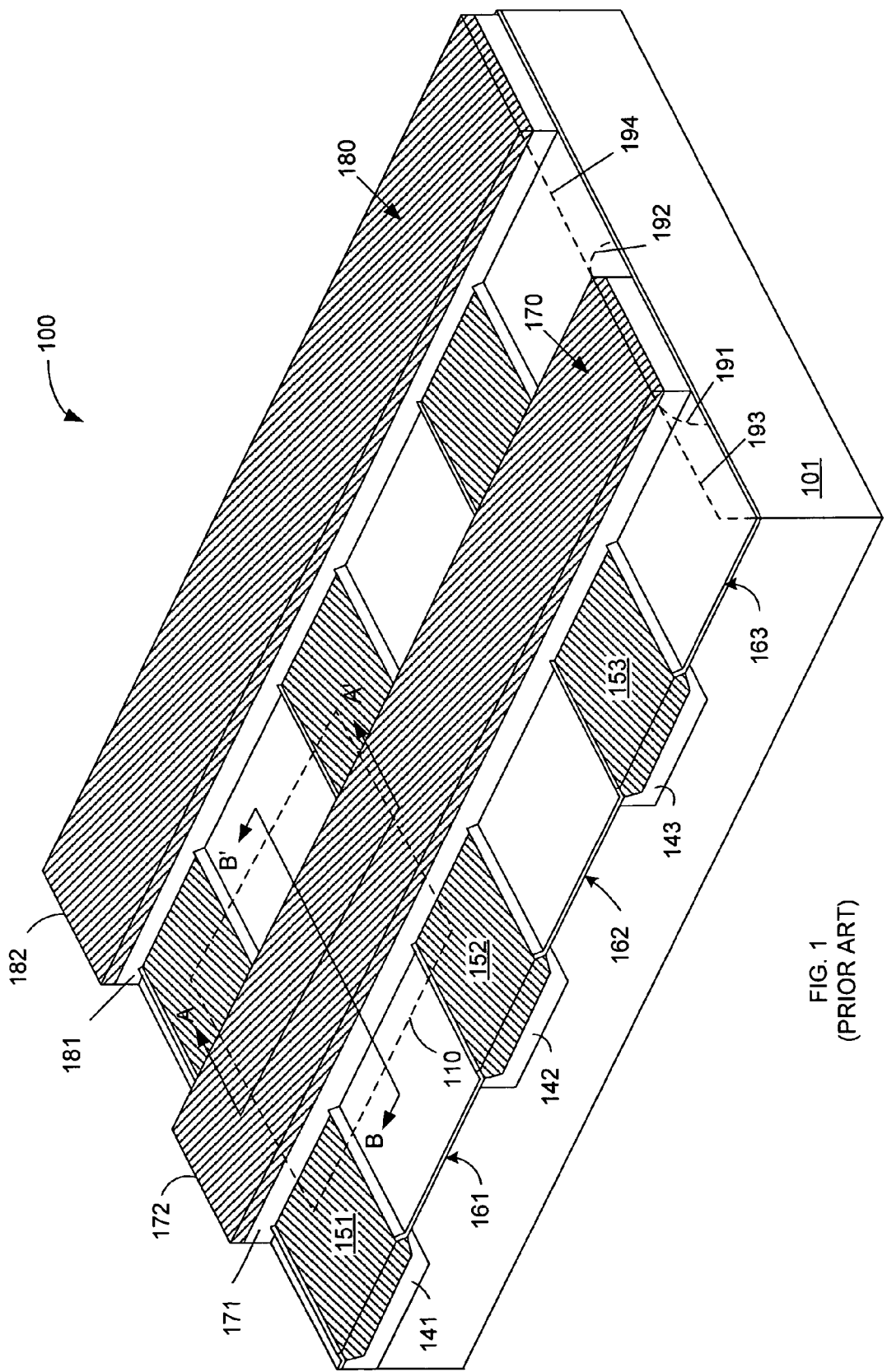
FIG. 1 is an isometric view of a portion of a conventional fieldless array, which includes a plurality of 2-bit non-volatile memory transistors arranged in a plurality of rows and columns.
Figure 2A:
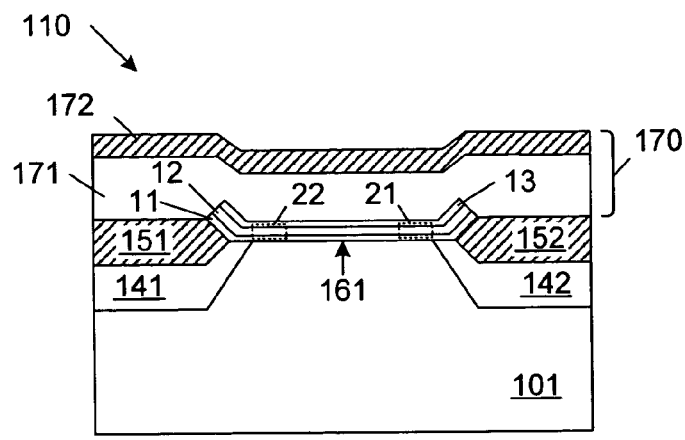
FIG. 2A is a cross sectional view of a fieldless array transistor along section line A–A' of FIG. 1.
Figure 2B:
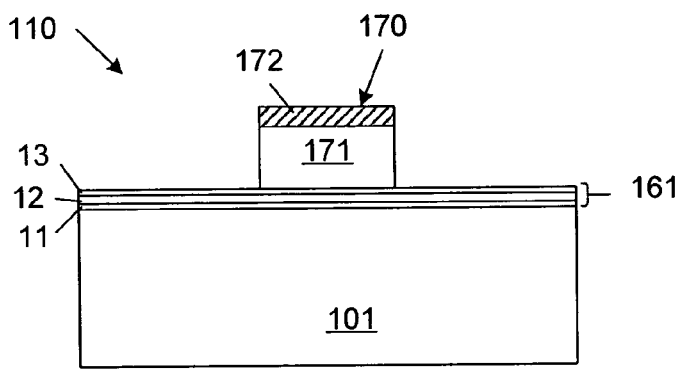
FIG. 2B is a cross sectional view of a fieldless array transistor along section line B–B' of FIG. 1.
Figure 3:
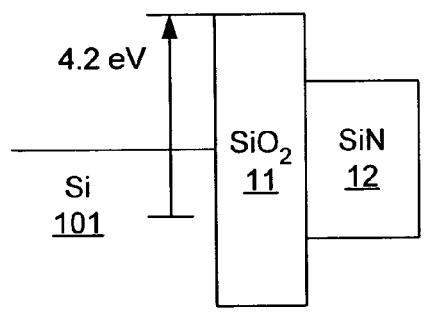
FIG. 3 is a schematic diagram illustrating the charging process associated with electron excitation from the valence band of silicon.
Figure 4A:
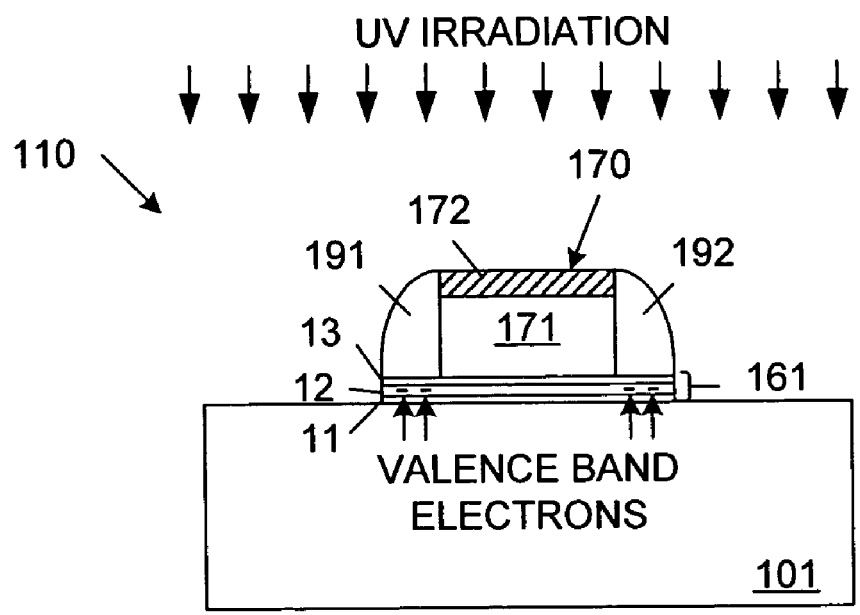
FIGS. 4A and 4B are cross sectional view of a fieldless array transistor along section line B–B' of FIG. 1, which illustrate the manner in which a silicon nitride layer is charged in response to UV irradiation.
Figure 4B:
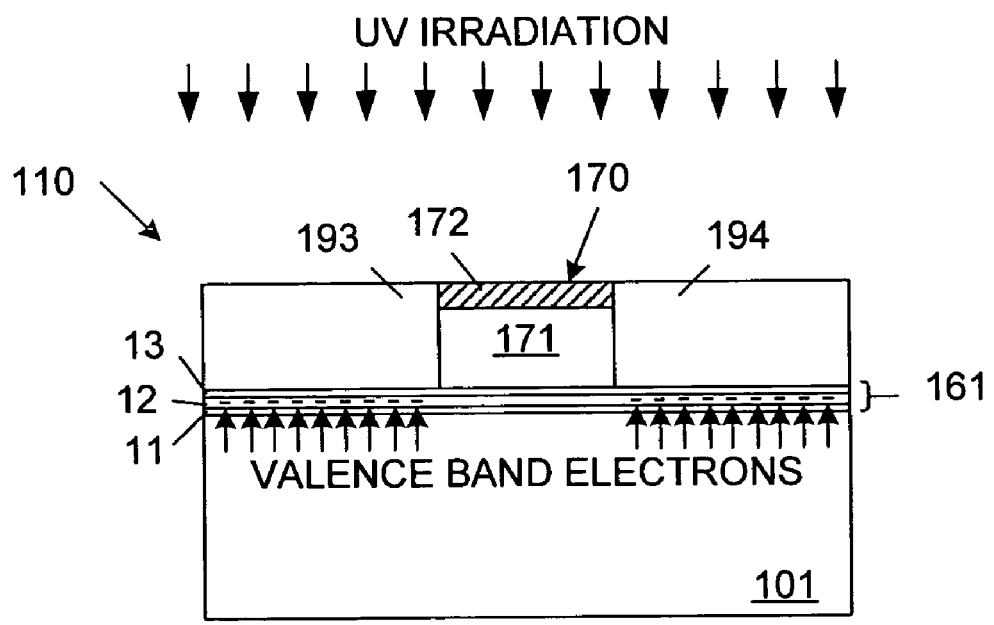
Figure 5:
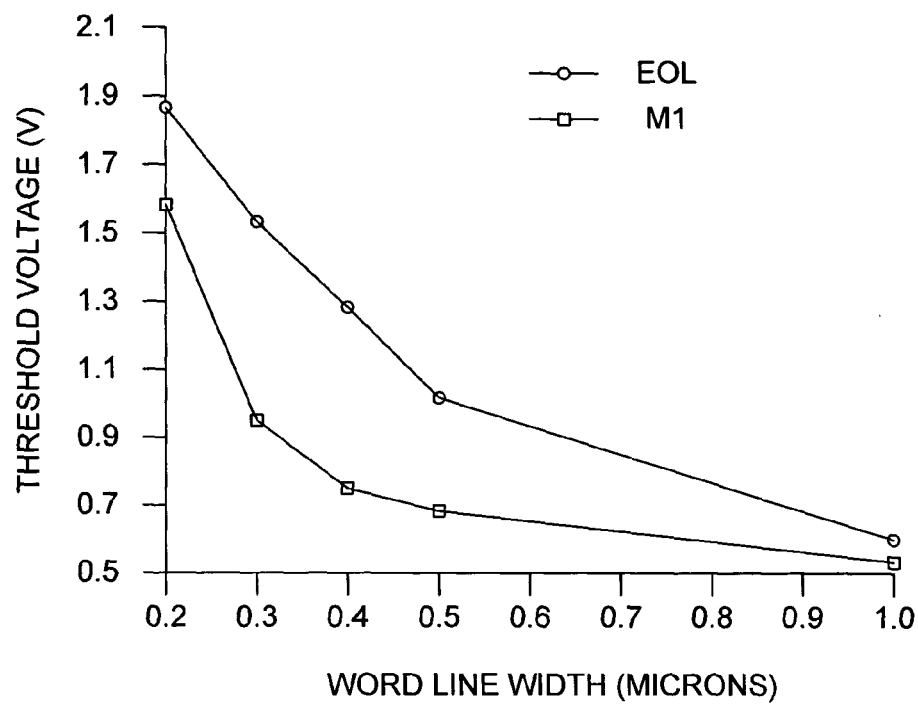
FIG. 5 is a graph of that illustrates the relationship between threshold voltage increase and polysilicon word line width at a metal-1 (M1) process stage and an end of line (EOL) process stage.
Figure 6:
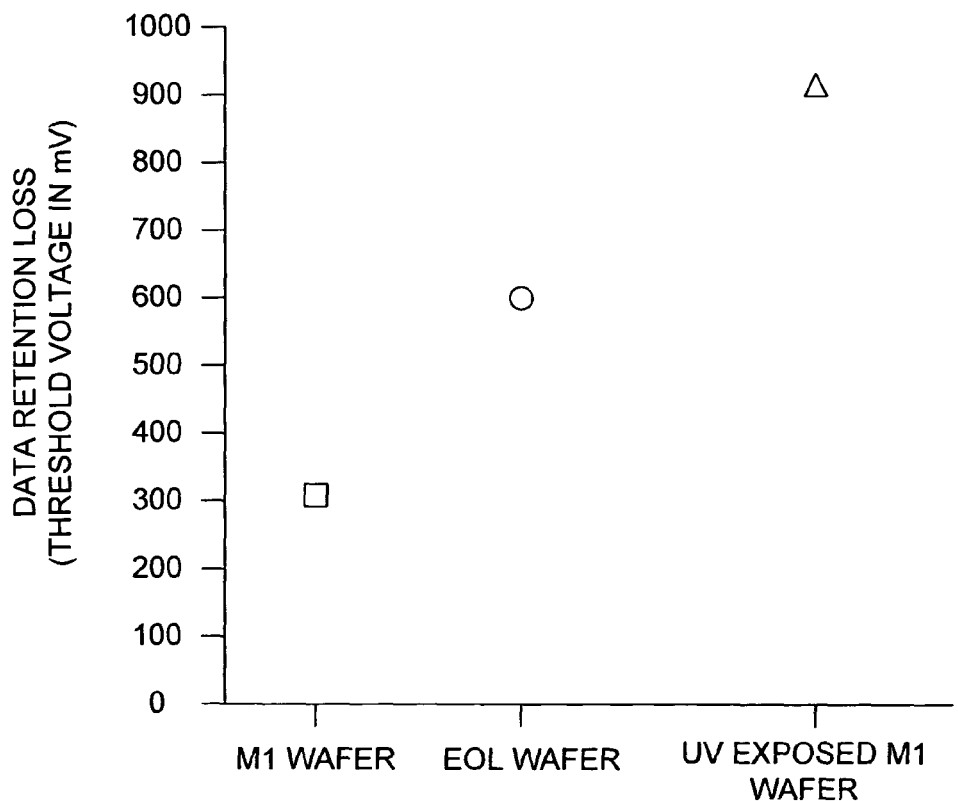
FIG. 6 is a graph illustrating data retention loss at the EOL stage compared with the retention loss at the M1 stage.

Because ONO structures 761–766 are located entirely under word lines 770 and 780, these ONO structures are substantially shielded from exposure to UV irradiation. This is because polysilicon layers 771 and 781 block the UV irradiation. Because ONO structures 761–766 (and the underlying portions of silicon substrate 701) are shielded from UV irradiation during subsequent processing steps, these ONO structures 761–766 are subject to less electronic charging than the ONO layers 161–163 of the prior art (FIG. 1). Reducing the amount of electronic charge trapped in ONO structures 761–766 advantageously reduces the threshold voltage increase as the widths of the word lines 770 and 780 decrease along the first axis.

The fabrication of fieldless array 700 will now be described, in accordance with one embodiment of the present invention.

FIGS. 10A–10E are cross sectional views of fieldless array 700 along section line AA–AA' of FIG. 7 during various process steps. FIGS. 11A–11I are cross sectional views of fieldless array 700 along section line BB–BB' of FIG. 7 during various process steps.

The described process is a twin-well process. Initially, the high voltage n-wells are formed within semiconductor substrate 701, followed by the low voltage n-wells and the p-wells. These well regions are not illustrated in the Figures for purposes of clarity. In the described embodiment, fieldless array 700 is fabricated in a p-type region of a monocrystalline silicon substrate.

As illustrated in FIG. 10A, bottom silicon oxide layer 1001 is deposited or created on the surface of semiconductor substrate 701. A floating gate silicon nitride layer 1002 is then deposited on the upper surface of bottom silicon oxide layer 1001. Then, a top silicon oxide layer 1003 is either deposited or created on floating gate silicon nitride layer 1002. In the described embodiment, bottom silicon oxide layer 1001 is a layer of thermally grown silicon oxide having a thickness in the range of about 20 to 200 Angstroms. Floating gate silicon nitride layer 1002 is formed by depositing a layer of silicon nitride having a thickness in the range of about 30 to 300 angstroms. The upper surface of silicon nitride layer 1002 is thermally oxidized at a high temperature (e.g., 850 to 1100° C.) in the presence of hydrogen and oxygen, thereby creating top silicon oxide layer 1003. Alternately, top silicon oxide layer 1003 can be deposited over silicon nitride layer 1002.

A layer of photoresist is then deposited over the upper surface of silicon oxide layer 1003. This photoresist layer is exposed and developed to create a photoresist mask 1010 having openings 1011–1013, as illustrated in FIG. 10A. Openings 1011–1013 are located to define the locations of diffusion bit lines 741–743, respectively, of fieldless array 700. High angle implants are then performed through openings 1011–1013. More specifically, a P-type impurity, such as boron, is implanted through openings 1011–1013 of photoresist mask 1010 at acute and obtuse angles with respect to the surface of semiconductor substrate 701, such that the dopant extends under the edges of photoresist mask 1010. The implanted boron serves to adjust the threshold voltages of the fieldless array transistors. An additional n-type counter-doping implant can also be implemented (using similar parameters) to improve junction edge optimization. The high-angle implanted P-type (N-type) impurities are illustrated as regions 1021–1023 in FIG. 10A.

As illustrated in FIG. 10B, after performing the high angle implants, the portions of top silicon oxide layer 1003 and silicon nitride layer 1002 that are exposed by openings 1011–1013 are removed. In one embodiment, these layers are removed by a two step dry etch, which is performed by a low pressure, high-density plasma etcher. In one embodiment, both steps are isotropic etches that use non-directed plasma. As a result, zero proximity effect (micro-loading) is achieved, and ion bombardment is reduced to a minimum level.

An N-type impurity, such as arsenic, is then implanted through openings 1011–1013 of photoresist mask 1010. The implanted N-type impurities are illustrated as regions 1031–1033 in FIG. 10B. These N-type impurities have a higher concentration than the previously implanted P-type impurities, such that the N-type impurities subsequently form the source/drain regions of the fieldless array transistors.

As illustrated in FIG. 10C, photoresist mask 1010 is then stripped, and a thermal oxidation step is performed, thereby creating bit line oxide regions 751–753. The growth of bit line oxide regions 751–753 causes the ends of silicon nitride layer 1002 and silicon oxide layer 1003 which are adjacent to bit line oxide regions 751–753 to bend upward, thus forming ONO structures 1041–1043. Note that ONO structures 1041–1043 extend the entire width of fieldless array 700, along the first axis. In one embodiment, bit line oxide is thermally grown to a thickness in the range of 200 to 1000 Angstroms using a wet oxidation process. This oxidation step also activates and diffuses the implanted impurities in regions 1021–2023 and 1031–1033, thereby forming diffusion bit lines 741–743.

Figure 10E:
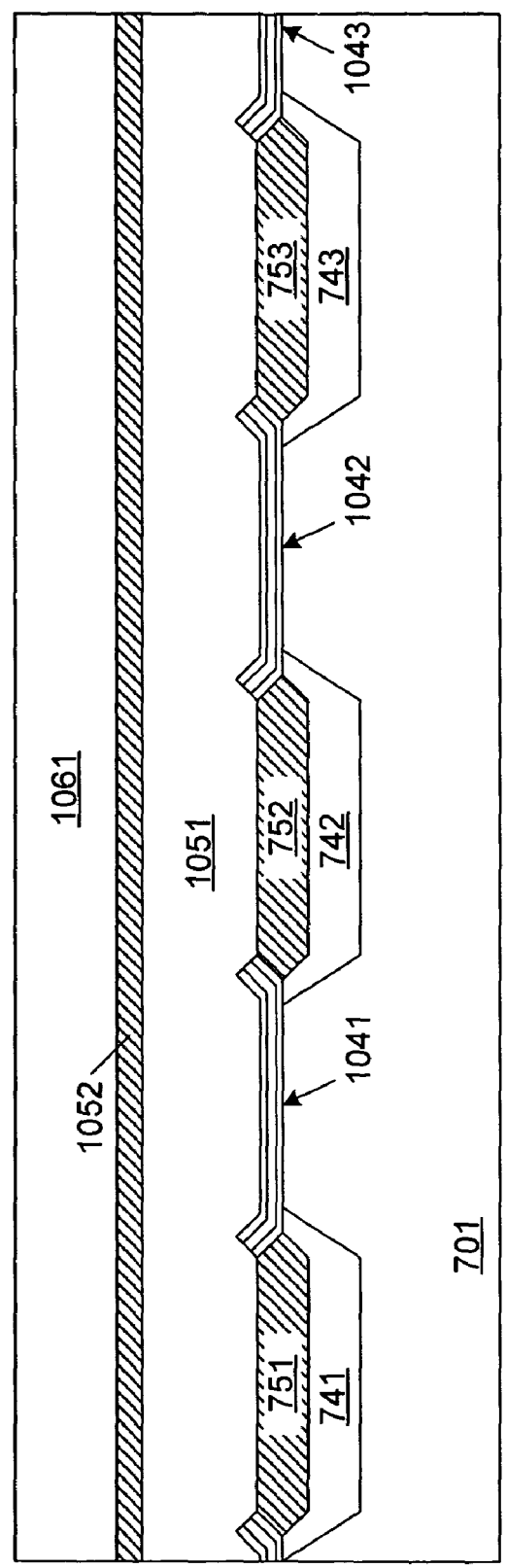
Figure 11A:
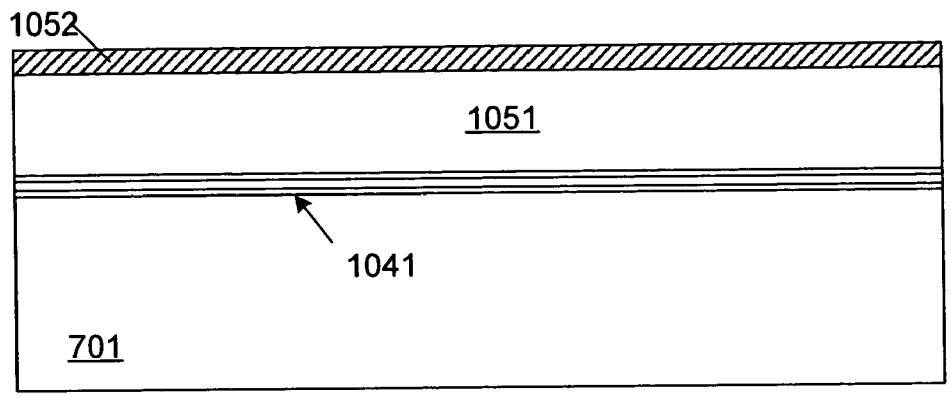
FIGS. 11A–11I are cross sectional views of the fieldless array of FIG. 7 along section line BB–BB' of FIG. 7 during various process steps.

As illustrated in FIGS. 10D and 11A, a blanket layer of polysilicon 1051 is then deposited over the upper surface of the resulting structure. In some embodiments, phosphorus oxychloride ($POCl_3$) is used to dope polysilicon layer 1051 to increase the conductivity of polysilicon layer 1051. Other embodiments may implant impurities such as phosphorus or arsenic ions to increase the conductivity of polysilicon layer 1051. A layer of metal silicide, such as tungsten silicide, is deposited directly on polysilicon layer 1051 to form metal silicide layer 1052. In an alternate embodiment, a blanket layer of a refractory metal, such as tungsten, titanium, or cobalt, is sputtered over the upper surface of polysilicon layer 1051. In yet another embodiment, metal silicide is not formed over polysilicon layer 1051.

Figure 11B:
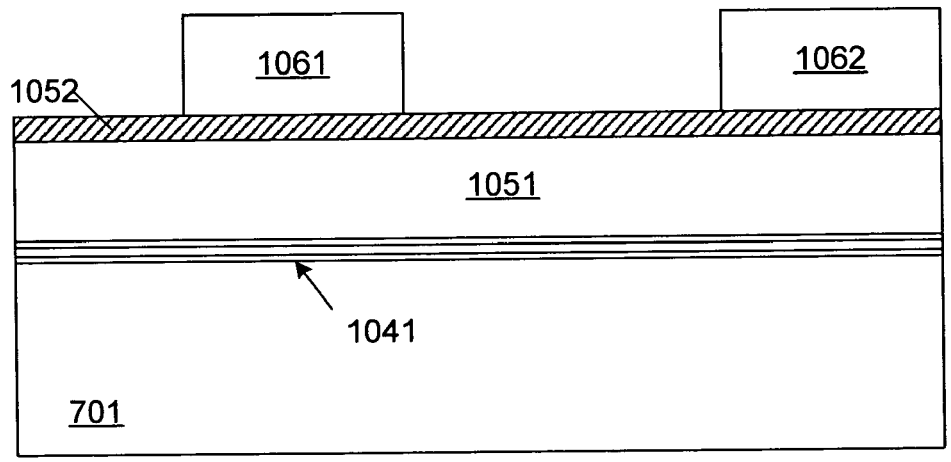

A layer of photoresist is then deposited over the resulting structure. This photoresist layer is exposed and developed to form a photoresist mask, which includes photoresist regions 1061–1062 as illustrated in FIGS. 10E and 11B. Photoresist regions 1061 and 1062 define the locations of word lines 770 and 780, respectively, of fieldless array 700.

Figure 11C:
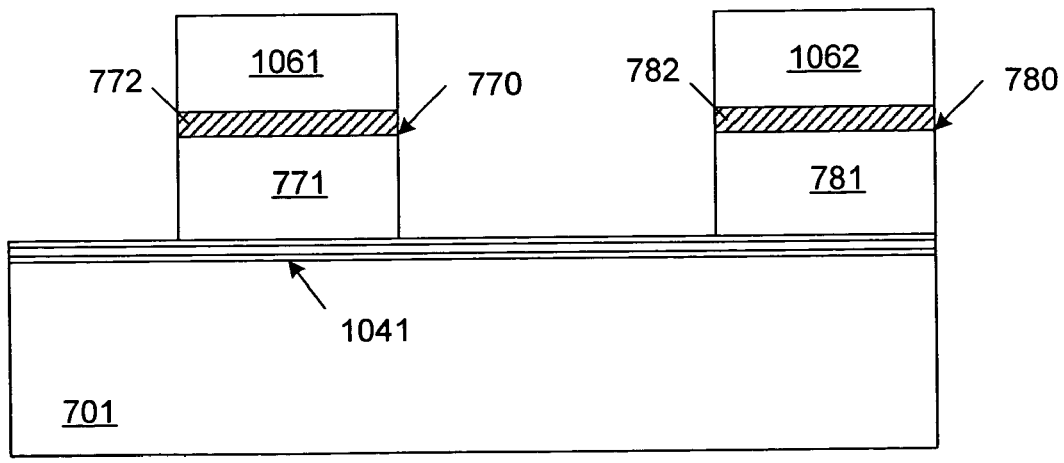

As illustrated in FIG. 11C, an etch is then performed to remove the portions of metal silicide layer 1052 and polysilicon layer 1051 that are exposed by photoresist regions 1061–1062. As a result, word lines 770 and 780 are formed. In one embodiment, the polycide etch is a dry etch. Metal silicide layer 1052 can be etched with a gas mixture of HBr, $SF_6$ and He. Polysilicon layer 1051 can be etched with a gas mixture of HBr and $Cl_2$ until the underlying ONO structures 1041–1043 are exposed. Alternately, polysilicon layer 1051 can be etched with a reactive ion etch (RIE).

Figure 11D:
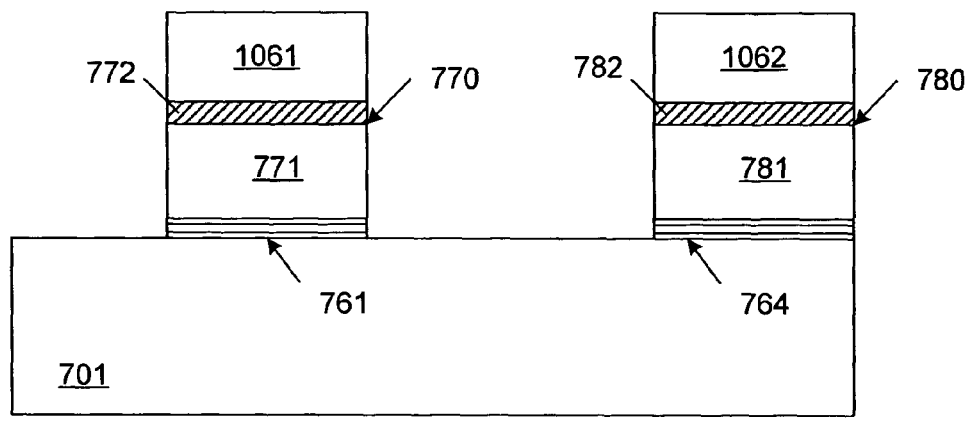

As illustrated in FIG. 11D, the exposed portions of ONO structures 1041–1043 are then removed between word lines 770 and 780. In one embodiment, ONO structures 1041–1043 are etched by prolonging the polysilicon RIE etch. In this embodiment, the polysilicon RIE etch must be aggressive enough to remove the exposed portions of ONO structures 1041–1043. For example, the corresponding RIE etch may consist of the two following steps: 1) an RIE etch in a $C_4F_8/O_2/Ar$ mixture at a pressure of 120 mTorr, a power of 100 Watts and a time of 5–30 seconds, and 2) an RIE etch in a $Ar/CH_3F/O_2$ mixture at a pressure of 480 mTorr, a power of 100 Watts and a time of 5–30 seconds. More specifically, the polysilicon RIE etch must be able to remove the top silicon oxide layer 1003 and the silicon nitride layer 1002. Portions of bottom silicon oxide layer 1001 may or may not remain. Penetration into silicon substrate 701, to a depth up to 400 A, is possible.

In another embodiment, an ONO etch recipe is applied to the exposed portions of ONO structures 1041–1043 after the polysilicon layer 1051 has been etched. This process can be stopped on the bottom silicon oxide layer 1001. Alternately, this process can be stopped on semiconductor substrate 701, or penetrate into this substrate, and another silicon oxide layer can be subsequently thermally grown.

In one embodiment, the ONO layers are removed by a dry etch, which is performed by a low pressure, high-density plasma etcher. In one embodiment, this is an isotropic etch that uses non-directed plasma. As a result, zero proximity effect (micro-loading) is achieved, and ion bombardment is reduced to a minimum level.

The dry etch removes the exposed portions of top silicon oxide layer 1003 by flowing only a flourohydrocarbon gas, such as $CHF_3$, at a flow rate of about 50 to 200 standard cubic centimeters per minute (sccm) in a 3.2 liter etcher in a plasma assisted isotropic etch that uses plasma power ranging from 200 to 400 Watts and a low pressure that ranges from 5 to 15 milli-Torr. The etch time is calculated to remove all of the exposed portions of top silicon oxide layer 1003, and the underlying silicon nitride layer 1002. In one embodiment, the etch time is approximately 20 to 70 seconds. The wafer is maintained at a temperature of about 10° C. to about 100° C. during the above-described etch.

In yet another embodiment, an ONO wet etch can be performed to remove the exposed portions of ONO structures 1041–1043 after the polysilicon layer 1051 has been etched. Hot phosphoric acid (HPH) at 165° C. is employed in this embodiment. This wet etch may remove (undercut) parts of ONO structures 1041–1043 beneath word lines 770 and 780. In some cases, this undercutting is done on purpose to have controllable removal of silicon nitride at the edges of the word lines. The penetration depth of the wet etch is about 50–100 A. Electrons excited from substrate 701 and the edges of polysilicon regions 771 and 781 can diffuse a certain distance under the word lines 770 and 780, before trapping occurs. By performing an undercutting etch on ONO structures 1041–1043, the resulting electron trapping is reduced.

An additional re-oxidation step is performed after an ONO removal etch that penetrates into substrate 701 or makes undercuts in the silicon nitride regions located under the word lines. In this re-oxidation step, a thermal oxide layer is grown to a thickness of about 20–200 A over substrate 701 and the sidewalls of word lines 770 and 780. This re-oxidation step is performed to enhance data retention properties by reducing leakages at the edges of the word lines.

After the polycide etch and ONO etches are completed, photoresist regions 1061–1062 are stripped and a metal silicide anneal is then performed. This anneal adheres the metal silicide to the underlying polysilicon and is part of the activation of the impurities in the buried diffusion bit lines 741–743. A boron implant can then be performed to prevent current leakage between diffusion bit lines at the locations between adjacent gates electrodes in the fieldless array. This boron implant is a blanket implant, with no mask protection provided on the wafer.

At this time, the state of the fieldless array is substantially illustrated by FIG. 7.

Figure 11E:
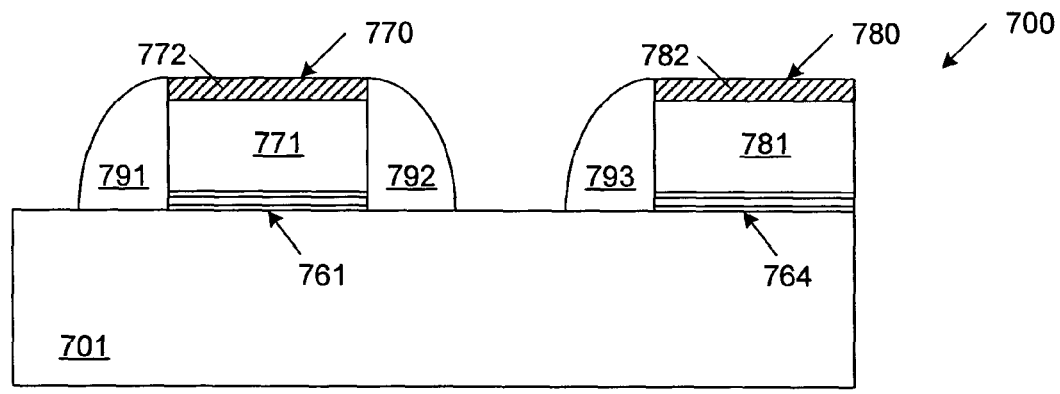
Figure 11F:
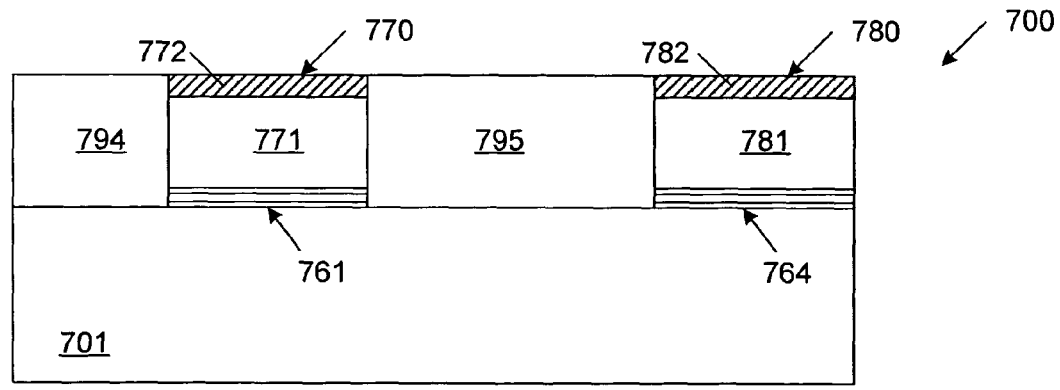

A dielectric layer is then deposited over the resulting structure. In one embodiment, this dielectric layer is silicon oxide, deposited to a thickness in the range of 1000 to 2500 Angstroms, in accordance with conventional CMOS processing techniques. This dielectric layer is then etched back in accordance with conventional CMOS processing techniques to form dielectric sidewall spacers 791–793 as illustrated in FIG. 11E. Alternately, gap-filling oxide 794–795 can be formed between the word lines, as illustrated in FIG. 11F.

Figure 11G:
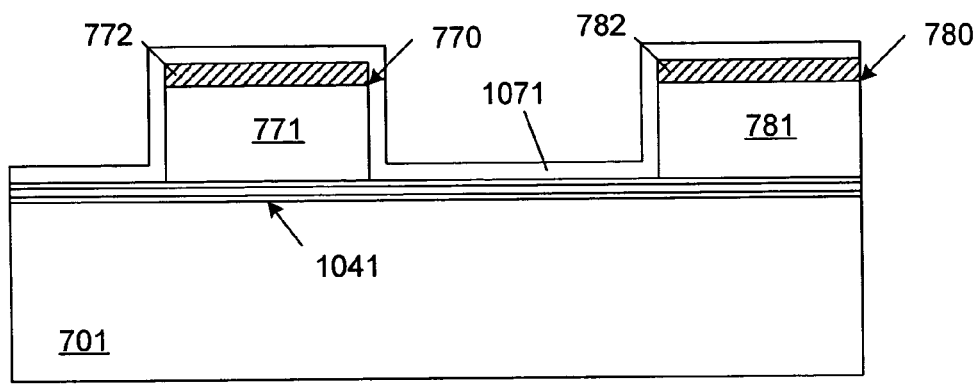
Figure 11H:
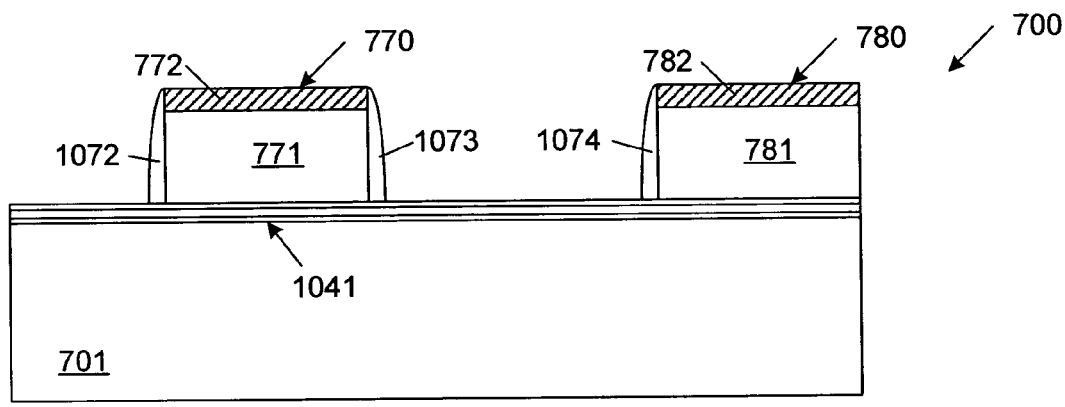
Figure 11I:
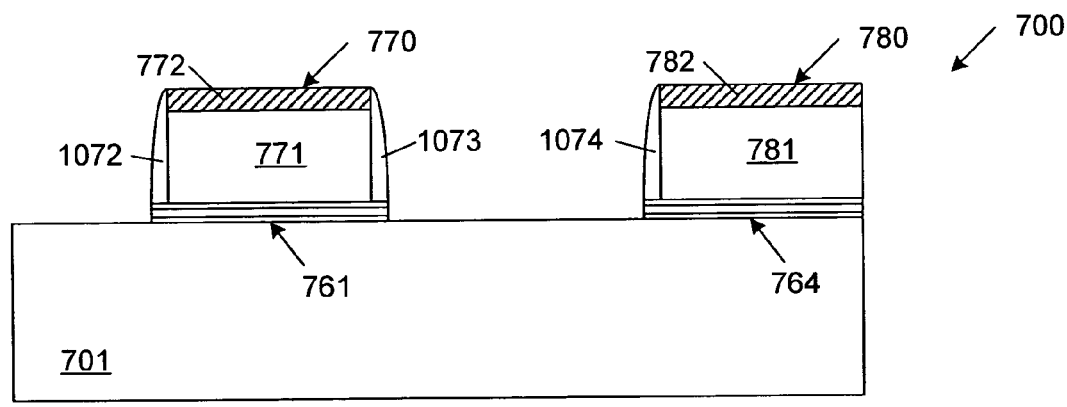

In yet another embodiment, a thin spacer dielectric layer 1071 (e.g., a high-temperature oxide (HTO) fabricated by $SiH_4+N_2O$ at 850° C.) is deposited over ONO structures 1041–1043 and word lines 770 and 780, as illustrated in FIG. 11G. This thin spacer dielectric layer 1071 can have a thickness on the order of 50 to 300 Angstroms. An etch back is then performed, thereby forming thin sidewall spacers 1072–1074, as illustrated in FIG. 11H. An ONO etch can then be performed thereby removing the exposed portions of ONO structures 1041–1043, as illustrated in FIG. 11I. In one embodiment, this ONO etch is an HPH etch performed at a temperature of about 165° C. As a result, ONO structures 761–766 extend slightly beyond the edges of word lines 770 and 780. Simulations have shown that charges trapped in ONO structures 761–766 up to distances of 400–500 A from the edges of word lines 770 and 780 significantly contribute to changes in the transistor threshold voltage Vt. Thus, if ONO is removed outside the thin (50–300 A) spacers 1072–1074, improvement is observed. Although there will be some charging of the ONO remaining under the thin spacers 1072–1074, this charging will be much smaller than on prior art fieldless array transistors. An advantage of this embodiment is protection of the word line sidewalls during the etches that remove ONO layers 1041–1043 outside the word lines 770 and 780. Dielectric sidewall spacers, such as those illustrated in FIG. 11E, or gap-filling oxide, such as that illustrated in FIG. 11F, can be then formed over the structure of FIG. 11I.

During subsequent processing steps, the interconnect structure of fieldless array 700 is formed. This interconnect structure is well known to those of ordinary skill in the art, and involves the alternating formation of inter-level dielectric layers and metal layers. More specifically, an inter-level dielectric layer is deposited, and a photoresist mask is formed over the inter-level dielectric layer to define the locations of contacts. One or more etches are then performed through the photoresist mask, thereby forming openings through the inter-level dielectric layer to permit the subsequent formation of contacts. The photoresist mask is stripped, and a metal layer is then deposited over the patterned inter-level dielectric layer. A second photoresist mask is formed over the metal layer to define the first interconnect layer. An etch is then performed through the second photoresist mask, thereby forming the first interconnect layer. This process is then repeated until the interconnect structure is complete.

During the formation of the interconnect structure, the underlying structures are exposed to UV irradiation. However, polysilicon layers 771 and 781 block the UV radiation from reaching substrate 701. Because no portions (or very small portions) of ONO structures 761–766 extend beyond the edges of polysilicon layers 771 and 781, these ONO structure 761–766 are not subject to significant electronic charging in response to the UV irradiation.

Figure 12:
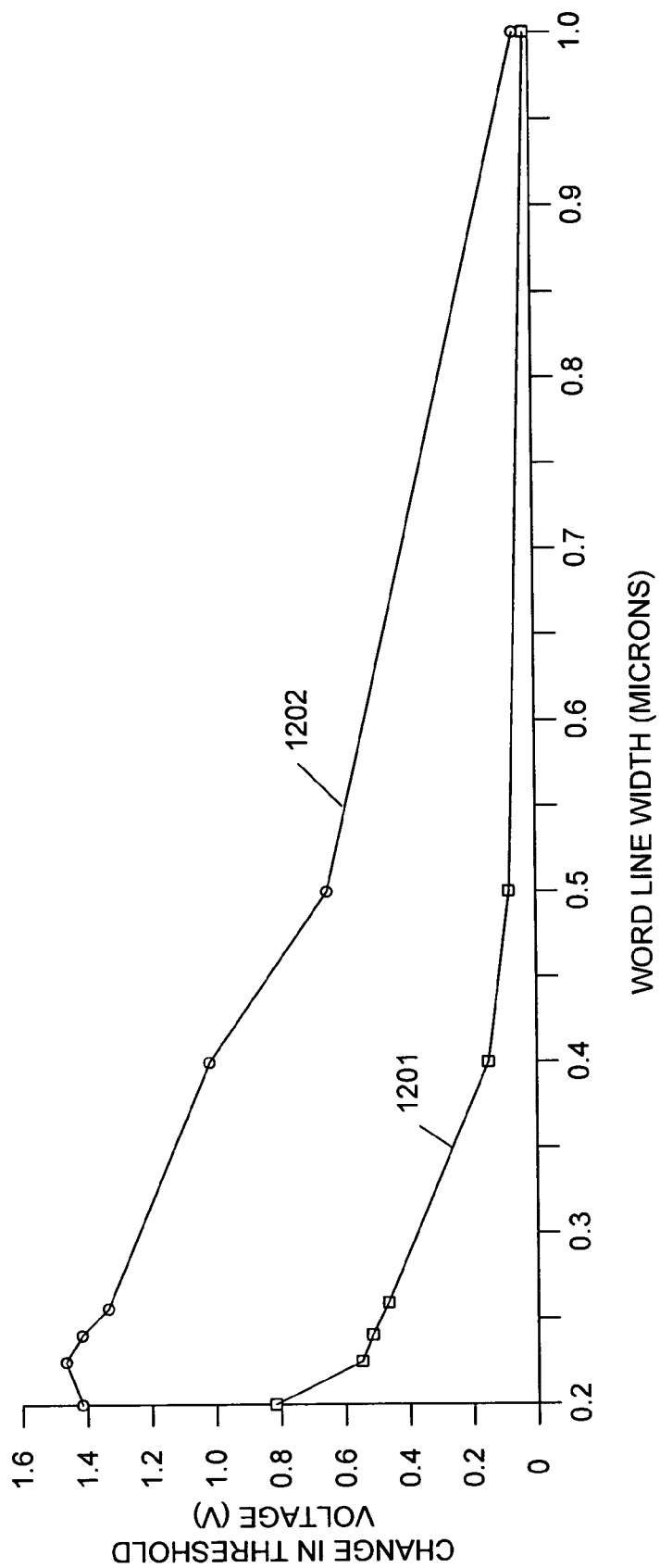
FIG. 12 is a graph illustrating improvement in threshold voltage as a function of word line width.

FIG. 12 is a graph that illustrates the improved threshold voltages associated with the present invention. More specifically, line 1201 of FIG. 12 illustrates the threshold voltage of fieldless array transistor 710 as a function of transistor width. Similarly, line 1202 of FIG. 12 illustrates the threshold voltage of fieldless array transistor 110 (FIG. 1) as a function of transistor width. Advantageously, the threshold voltage of fieldless array transistor 710 is on the order of 0.5 Volts lower than the threshold voltage of fieldless array transistor 110.

Although the invention has been described in connection with several embodiments, it is understood that this invention is not limited to the embodiments disclosed, but is capable of various modifications, which would be apparent to a person skilled in the art. For example, it is understood that the various described p-type regions can be interchanged with the described n-type regions to provide similar results. Thus, the invention is limited only by the following claims.

We claim:

1. A method of fabricating a fieldless array, the method comprising:
   forming an oxide-nitride-oxide (ONO) layer over a surface of a semiconductor region;
   patterning the ONO layer to create a first set of ONO structures that define locations for a plurality of diffusion bit lines of the fieldless array; then
   forming a plurality of word lines over the first set of ONO structures; and then
   patterning the first set of ONO structures, thereby creating a second set of ONO structures, wherein the second set of ONO structures are located entirely under the plurality of word lines.

2. The method of claim 1, further comprising forming dielectric sidewall spacers adjacent to the word lines.

3. The method of claim 1, further comprising forming gap-filling oxide between the word lines.

4. The method of claim 1, further comprising implanting diffusion bit lines through the first set of ONO structures.

5. The method of claim 4, further comprising thermally growing bit line oxide regions over the diffusion bit lines.

6. The method of claim 4, wherein the diffusion bit lines extend along a first axis, and the word lines extend along a second axis, perpendicular to the first axis.

7. The method of claim 1, wherein the steps of forming a plurality of word lines and patterning the first set of ONO structures comprise:
   depositing a layer of polysilicon over the first set of ONO structures;
   forming a photoresist mask over the layer of polysilicon;
   etching the layer of polysilicon through the photoresist mask; and
   etching the first set of ONO structures through the photoresist mask.

8. The method of claim 7, wherein the steps of etching the layer of polysilicon and the first set of ONO structures are implemented by a reactive ion etch (RIE).

9. The method of claim 7, wherein the step of etching the first set of ONO structures is implemented by a series of wet etches.

10. The method of claim 7, wherein the step of etching the first set of ONO structures is implemented by a wet etch and a dry/reactive ion etch (RIE).

11. The method of claim 7, wherein the step of etching the first set of ONO structures is extended to etch the semiconductor substrate to a depth of 50 to 400 Angstroms.

12. The method of claim 7, further comprising performing a re-oxidation step after the step of etching the first set of ONO structures.

13. The method of claim 12, wherein the re-oxidation step results in the formation of about 20–200 Angstroms of silicon oxide.

14. The method of claim 7, wherein the step of etching the first set of ONO structures results in the removal of portions of the first set of ONO structures under the layer of polysilicon.

15. The method of claim 1, wherein the steps of forming a plurality of word lines and patterning the first set of ONO structures comprise:

depositing a layer of polysilicon over the first set of ONO structures;

patterning the layer of polysilicon;

depositing a thin dielectric spacer having a thickness up to about 400 Angstroms over the patterned layer of polysilicon;

etching back the thin dielectric spacer layer, prior to etching the first set of ONO structures etching the first set of ONO structures through the etched back thin dielectric spacer layer.

\* \* \* \* \*